United States Patent [19]
Gray

[11] Patent Number: 4,710,793
[45] Date of Patent: Dec. 1, 1987

[54] VOLTAGE COMPARATOR WITH HYSTERESIS

[75] Inventor: Randall C. Gray, Tempe, Ariz.

[73] Assignee: Motorola, Inc., Schaumburg, Ill.

[21] Appl. No.: 772,579

[22] Filed: Sep. 4, 1985

[51] Int. Cl.⁴ .................... H01L 27/02; H03K 3/33; H03K 5/153; H03K 19/20

[52] U.S. Cl. .................................. 357/44; 357/46; 357/40; 357/43; 307/300; 307/290; 307/359; 307/360; 307/455; 307/495

[58] Field of Search .................... 307/300, 229 B, 455, 307/290, 359, 360; 357/44, 46

[56] References Cited

U.S. PATENT DOCUMENTS

| | | | |
|---|---|---|---|
| 3,676,714 | 7/1972 | Wensink | 307/303 |
| 4,104,547 | 8/1978 | Frederiksen | 307/362 |
| 4,375,598 | 3/1983 | Sakai | 307/360 |

Primary Examiner—Martin H. Edlow
Assistant Examiner—Don Featherstone
Attorney, Agent, or Firm—Michael D. Bingham

[57] ABSTRACT

A differential amplifier operated as a voltage comparator includes first and second transistors coupled to first and second inputs respectively of the comparator whereby an applied input signal produces output transitions at an output of the differential amplifier as the input signal passes through and exceeds a first threshold voltage established at the second input of the differential amplifier. A hysteresis producing circuit is coupled to the differential amplifier which is responsive to the applied input signal exceeding the first threshold voltage for establishing a second threshold voltage, which is less than the first threshold voltage, whereby the input signal has to decrease below the value of the first threshold voltage to the second threshold voltage in order for the differential amplifier to switch back to its original operating state wherein hysteresis is established. A P-collector region is provided that is responsive to the second transistor of the differential amplifier being driven into saturation for collecting the saturation current thereof to inhibit this current from being injected into the substrate of the integrated circuit in which the voltage comparator is realized.

2 Claims, 4 Drawing Figures

VOLTAGE COMPARATOR WITH HYSTERESIS

BACKGROUND OF THE INVENTION

The present invention relates to voltage comparators and, more particularly, to voltage comparator circuits having hysteresis for producing output transitions when an applied voltage exceeds a first voltage threshold and then falls below a lower second voltage threshold.

The prior art is replete with voltage comparators which produce output transitions in response to an unknown voltage input signal exceeding a predetermined voltage level and then falling below this level. Many such comparators include circuitry for producing hysteresis. In these latter circuits, the comparator generally comprises a differential amplifier having a pair of inputs and an output at which the output transitions occur. The input signal is applied to a first one of the inputs of the differential amplifier while a first threshold voltage is applied to the other input. A hysteresis producing circuit is responsive to the input signal exceeding the first threshold voltage for establishing a second threshold voltage at the other input the magnitude of which is less than the first threshold voltage. In this manner, once the output of the comparator is tripped the input signal must decrease below the value of the second threshold voltage before the output of the comparator is once again tripped which places it in its original state. Hysteresis is produced due to the two different voltage levels required to trip the comparator between the two operating states. Hysteresis is required for voltage comparators used in a high noise environment where large voltage transient signals are not uncommon. When the input signal is in the vicinity of the first threshold voltage noise can cause the input to vary above and below the threshold voltage which would otherwise cause the comparator to oscillate rapidly between its two operating output states absence hysteresis. However, with hysteresis, if the first threshold voltage is well defined, as soon as the input signal exceeds the threshold voltage the comparator will change states causing the first voltage level to decrease to the second voltage level. This inhibits noise transients from producing the oscillations described above as is understood.

In one prior art voltage comparator a multicollector PNP transistor is utilized as a source of currents to the differential amplifier and the hysteresis producing circuit. In operation, as the input signal exceeds the first threshold voltage, the differential amplifier, which comprises first and second transistors, switches states such that current is sourced from one of the collectors of the multicollector transistor to supply current drive to a additional transistor included in the hysteresis producing circuit. The additional transistor is turned on causing the first threshold voltage level to be reduced by decreasing the voltage supplied at the base of the second transistor of the differential amplifier. Hence, the input signal must fall below this second threshold voltage level to cause the output of the voltage comparator to switch back to its original state.

A problem with the above described prior art voltage comparator is that the first threshold voltage is not well defined and does not remain fixed due to the mentioned second transistor being driven into saturation whenever the magnitude of the input signal is less than the first threshold voltage. Because the second transistor is in a saturated condition saturation current is emitted from its base, as is well understood, which is injected into the substrate of the integrated voltage comparator circuit due to the inherent parasitic PNP transistor formed at the collector of the second transistor. This lowers the first threshold voltage level. As the input signal increases in value, the second transistor tends to become less saturated. This allows the first threshold voltage level to increase as less saturation current is injected into the substrate. Hence, the value of the first threshold voltage moves up with the increasing input signal until such time that the second transistor is turned completely off by the input signal value exceeding the maximum permissible value of the first threshold voltage.

Thus, the prior art suffers in that the threshold voltage level at which the voltage comparator trips states is ill defined. This can permit undesirable oscillations to occur as the output is tripped between operating states if noise transients should occur at the input of the voltage comparator.

Hence, a need exists for an improved integrated voltage comparator circuit having hysteresis and a well defined trip point.

SUMMARY OF THE INVENTION

Accordingly, it is an object of the present invention to provide an improved comparator circuit.

It is another object of the present invention to provide an improved voltage comparator.

Still another object of the present invention is to provide an improved integrated voltage comparator.

Yet another object of the present invention to provide an improved integrated voltage comparator having hysteresis.

In accordance with the above and other objects there is provided an integrated circuit for producing output transitions in response to an input signal passing through and exceeding a first threshold level and then passing through and falling below a second threshold level whereby hysteresis is established wherein the integrated circuit comprises: a differential amplifier including first and second transistors coupled respectively to first and second inputs of the amplifier, the input signal being applied to the first input and the first and second threshold levels being alternately supplied to the second input, the differential amplifier having an output at which the transitions occur; a threshold level determining circuit for producing the first and second threshold levels at an output thereof which is coupled to the second input of the differential amplifier; and a collector region responsive to the second transistor of the differential amplifier becoming saturated for inhibiting saturation current therefrom being sourced to the substrate of the integrated circuit.

DETAILED DESCRIPTION OF THE PREFERRED EMBODIMENTS

Figure 1:
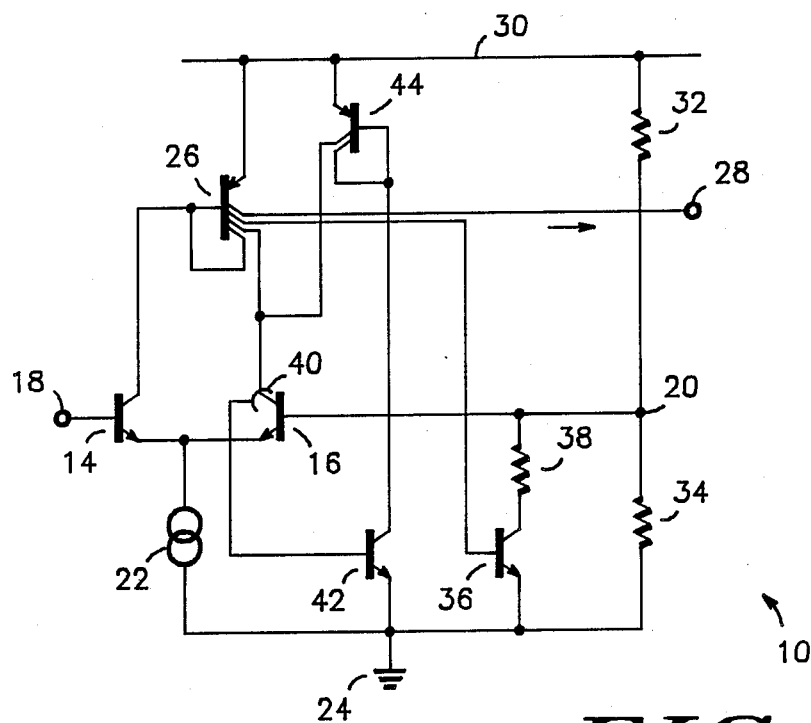
FIG. 1 is a schematic diagram of the voltage comparator of one embodiment of the present invention.

FIG. 1 is a schematic diagram of voltage comparator 10 which is intended to be manufactured in integrated circuit form. Comparator 10 includes a differential amplifier section 12 including NPN input transistors 14 and 16 which have their emitters differentially connected together. The base of transistor 14 is connected to input 18 of the differential amplifier to which a voltage input signal is applied. The base of transistor 16 is connected to a second input of the differential amplifier that is connected at node 20 to which is supplied a threshold voltage. The emitters of transistors 14 and 16 are connected through current source 22 to ground reference 24. Multiple collector PNP transistor 26 acts as a current source to supply the collector currents of transistors 14 and 16 as well as to produce output transitions at output 28. The emitter of transistor 26 is connected to power supply conductor 30 which is supplied an operating potential $V_{CC}$. A voltage resistive divider network comprising resistors 32 and 34 serially connected between power supply conductor 30 and ground reference 24 will produce a first threshold voltage level of predetermined magnitude at node 20 to the second input of differential amplifier 12.

The operation of the aforedescribed voltage comparator is conventional and is known. Thus, whenever the input voltage is less than the first threshold voltage established at node 20 the output of comparator 10 is at a first state (in the present case no output current flows from output 28). In this state, transistor 16 is operated in a saturated condition as it would otherwise be rendered conductive except for the fact that multicollector transistor 26 is biased off as there is no path for base current drive through the latter. However, as the input signal passes through and exceeds the value of the first threshold voltage level, transistor 14 is rendered conductive to provide a path for base current for transistor 26 while transistor 16 is completely shut off as the base and one collector of transistor 26 are connected together. Current is also sourced to output 28 as transistor 26 is turned on. Hence, the output state of voltage comparator 10 transitions to a second operating state. Voltage comparator 10 will remain in the second operating state until such time as the applied input voltage decreases below the value of the first threshold voltage level of 20 which will render transistors 14 and 26 nonconductive.

The above described operation of voltage comparator 10 assumes no hysteresis. However, in the present case, a hysteresis producing circuit comprising NPN transistor 36 having its collector and emitter path coupled via resistor 38 between node 20 and ground reference and its base connected to another collector of PNP transistor 26 will produce hysteresis in a circuit as will hereinafter be described. As soon as the applied input voltage exceeds the value of the first threshold voltage occurring at node 20, the current flowing through the collector of transistor 26 turns on transistor 36 as base drive is supplied thereto. As transistors 36 is turned on it forces the voltage at node 20 to be reduced to a second threshold voltage level since the resulting resistance at this node is reduced. Hence, the comparator 10 cannot transition back to its original state until such time as the applied input voltage decreases below the second threshold voltage level, which is lower than the first threshold voltage and hysteresis is established.

A problem that occurs with the aforedescribed voltage comparator relates to an ill defined first threshold voltage level caused by transistor 16 being operated in a saturated condition. For example, as is known, there is a parasitic PNP transistor formed between the base and collector of transistor 16 to the substrate of the integrated circuit. Thus, whenever the applied input voltage is below the first threshold voltage, transistor 16 as aforedescribed is in a saturated condition wherein the base-collector junction is forward biased. In this condition the PNP parasitic transistor is rendered conductive thereby causing the saturation current to be injected into the substrate of the integrated circuit. Thus, current is drawn through resistor 32 through the base of transistor 16 and its collector to the substrate because of this parasitic phenomena. This will have the effect of lowering the first threshold voltage whenever transistor 16 is in saturated condition. As the applied input voltage increases, transistor 16 is driven less into saturation which reduces the current flow through resistor 32 as less current is sourced therethrough by the parasitic device. This in turn will allow the voltage level at node 22 to increase. Hence, the actual threshold point at which comparator 10 transitions from one output state to the other is ill defined as the first threshold voltage increases as the applied input signal increases. Eventually, there is a point reached where the applied input voltage will cause transistor 14 to be rendered conductive as transistor 16 is turned off. At this point, the voltage comparator 10 will transition to its second operating state. Since the trip point is ill defined, any noise transients appearing on input 18 can cause false tripping or transitioning of voltage comparator 10 such that the comparator may oscillate.

To prevent the lowering of the first voltage level due to transistor 16 being operated in a heavy saturated state a P-collector ring 40 is provided which surrounds the collector region of transistor 16. As transistor 16 just goes into saturation the saturation current will be collected by P-ring 40 to provide base current drive to NPN transistor 42. Transistor 42 will be rendered conductive which turns on multicollector transistor 44 which has its base and one collector thereof connected to the collector of transistor 42, the emitter of which is connected to ground reference 24. Hence, a feedback path is created as transistors 42 and 44 are rendered conductive to provide current to the collector of transistor 16. Instead of transistor 16 drawing current through resistor 32 when it is saturated, the current collected by P-ring 40 is amplified through transistor 42 to supply the current required by transistor 16 via transistor 44 such that the former is just barely kept in saturation and the voltage level at node 20, as determined by the resistor divider network, is not substantially affected. Thus, a well defined trip point is established at which the output state of comparator 10 will transition as the applied input voltage exceeds the first threshold voltage developed across resistor 34.

Figure 2:
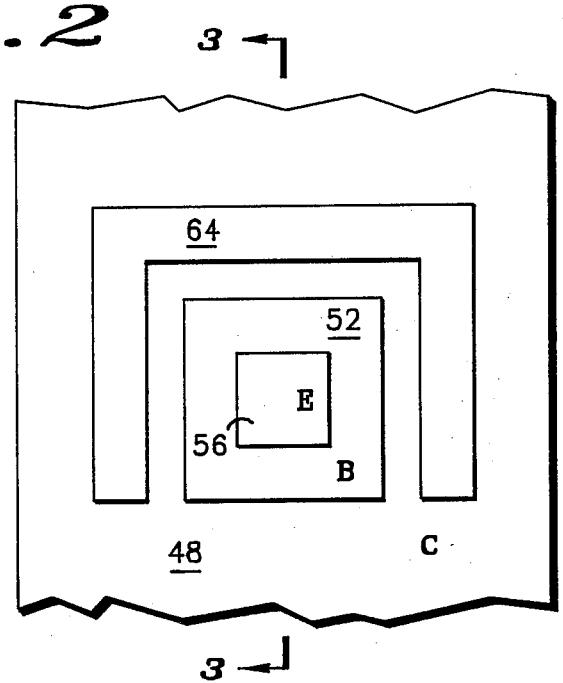
FIG. 2 is a top plan view of a portion of an integrated circuit comprising the comparator of FIG. 1.
Figure 3:
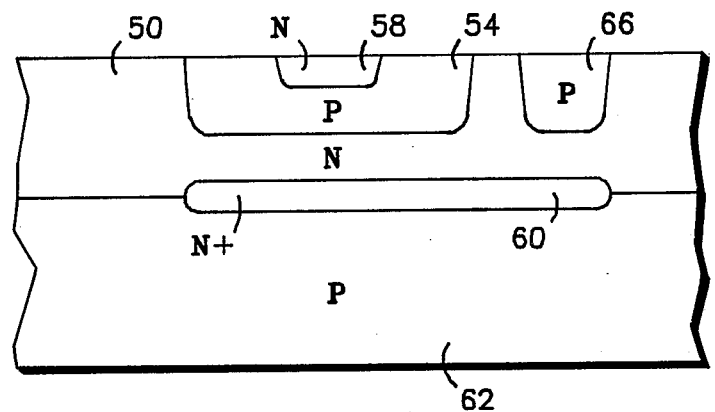
FIG. 3 is a cross-sectional view of the integrated circuit of FIG. 2.

Referring to FIGS. 2 and 3 P-ring 40 is described. Transistor 16 is formed by an emitter, base and collector region. Collector region 48 of transistor 16 is formed by epitaxial layer 50 (SEE FIG. 3). Base region 52 of transistor 16 is formed by P-region 54 formed, for example by deposition, in epitaxial layer 50. The emitter region 56 of transistor 16 is formed within base region 54 and is illustrated as including N region 58. The integrated circuit also includes a N+ buried layer 60 formed between epitaxial layer 50 and P substrate 62. The P-collector region 64 which corresponds to P region 66 is in spaced relationship to and surrounds the base region of transistor 16 and is formed within the collector region 48 of the integrated circuit. Hence, as P region 54 becomes forward bias with respect to epitaxial region 50 (the collector of transistor 16) by transistor 16 being driven into saturation, the minority carriers emitted from P region 54 will be collected by the secondary region 66 which forms a lateral PNP transistor therewith in conjunction with epitaxial layer 50. Thus, the saturation current is prevented from being injected unto P substrate 62 of the integrated circuit.

Figure 4:
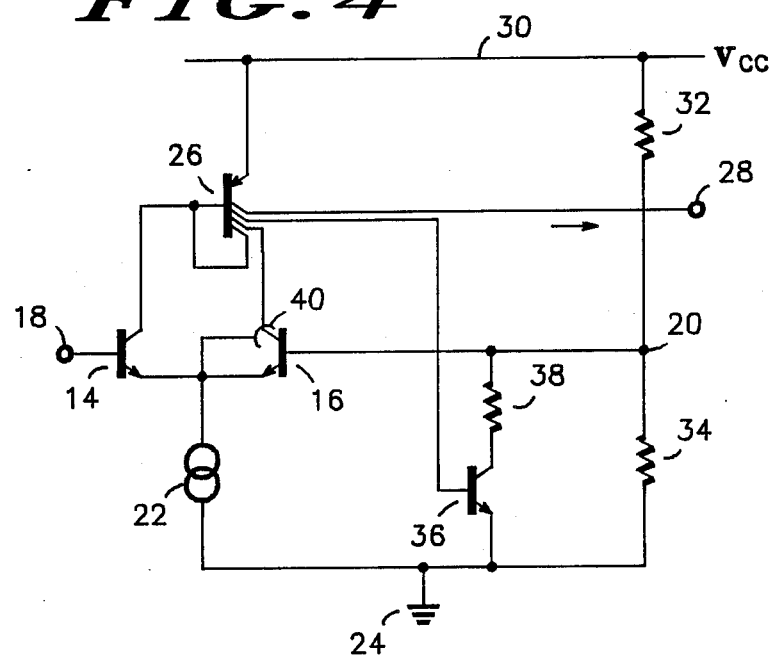
FIG. 4 is a schematic diagram of another embodiment of the present invention.

Referring now to FIG. 4 there is illustrated voltage comparator circuit 70 of another embodiment of the present invention. Voltage comparator 70 is very similar to voltage comparator 10 and like components thereof are numbered with the same reference numerals used to describe voltage comparator 10 of FIG. 1. In fact, the only difference between voltage comparator 70 and voltage comparator 10 is that P-collector ring 40 is returned to the commonly connected emitters of transistors 14 and 16 whereby the saturation current collected is returned to current source 22. Thus, transistor 16 is just operated in its saturated state whereby the saturation current is sourced through current source 22 to ground reference. Otherwise, the structure and operation of comparator circuit 70 is as aforedescribed with respect to comparator 10 whereby output transitions occur at output 28 as the applied input signal passes through and exceeds the first threshold voltage level developed at node 20 and then passes through and decreases below the second threshold voltage established by transistor 36 being rendered conductive.

The above description is given by way of example only, changes in form and details may be made by one skilled in the art without departing from the scope of the invention.

I claim:

1. An integrated circuit for producing output transitions in response to an input signal passing through and exceeding a first threshold voltage level then passing through and falling below a second threshold voltage level whereby hysteresis is established, comprising:

a differential amplifier including first and second transistors coupled respectively to first and second inputs of the differential amplifier, the input signal being applied to said first input, said differential amplifier having an output at which the transitions occur, said first and second transistors each having a collector region, a base region and an emitter region, said base regions being coupled respectively to said first and second inputs of said differential amplifier, said emitter regions being connected together, first current source means for providing currents to said collector regions of said first and second transistors, and second current source means coupled to said emitter regions of said first and second transistors, said first current source means including a transistor having multiple collector regions, the emitter region of which is coupled to a power supply, the base region being coupled to said collector region of said first transistor and to one of said multiple collector regions, a second one of said collector regions being coupled to said collector of said second transistor, and a third one of said collector regions being coupled to said output of said differential amplifier;

threshold level determining means for producing the first and second threshold voltage levels at an output which is coupled to said second input of said differential amplifier, said threshold level determining means including a plurality of resistors connected in series for establishing said first threshold voltage level corresponding to a first voltage level therebetween at said output of said threshold level determining means, and a third transistor the collector and emitter regions being coupled across one of said plurality of series connected resistors and having a base region coupled to a fourth one of said collector regions of said transistors of said first current source means, said third transistor being rendered conductive by the input signal exceeding said first threshold voltage level for causing said first threshold voltage level to be reduced to said second threshold voltage level; and collector means responsive to said second transistor becoming saturated for inhibiting saturation current therefrom being sourced to the substrate of the integrated circuit, said collector means including a secondary region formed within the integrated circuit in spaced relationship about said collector region of said second transistor, said secondary region collecting said saturation current that otherwise would be injected into the substrate and a fourth transistor the base region of which is connected to said secondary region and having a collector region and an emitter region, said emitter region being connected to a source of ground reference potential; and an additional multiple collector region transistor having an emitter region coupled to said power supply, a base region coupled with one of said multiple collector regions to said collector region of said fourth transistor, and a second one of said multiple collector regions being coupled to said collector region of said second transistor.

2. An integrated voltage comparator circuit having hysteresis for producing output transitions in response to an applied input signal passing through and exceeding a first threshold voltage, comprising:

a differential amplifier including first and second transistors each being coupled respectively to first and second inputs of said differential amplifier, the input signal being supplied to said first input, said differential amplifier including said first and second transistors each having a collector region, a base region and an emitter region, said base regions being coupled respectively to said first and second inputs of said differential amplifier, said emitter regions being connected together, first current source means for providing currents to said collector regions of said first and second transistors, second current source means coupled to said emitter regions of said first and second transistors, said first current source means including a multiple collector region transistor, the emitter region of which is coupled to a power supply, the base region being coupled to said collector region of said first transistor and to one of said multiple collector regions, a second one of said collector regions being coupled to said collector region of said second transistor, a third one of said collector regions being coupled to said output of said differential amplifier;

threshold level determining means for producing first and second threshold levels at an output thereof coupled to said second input of said differential amplifier, said first threshold level corresponding to said first threshold voltage, said threshold level determining means being responsive to the output transitions for providing said second threshold level at said output which corresponds to a second threshold voltage, said threshold level determining means including a plurality of resistors connected in series for establishing said first threshold voltage therebetween at said output, and a third transistor the collector and emitter regions being coupled across one of said plurality of series connected resistors and having a base region coupled to a fourth one of said collector regions of said transistor of said first current source means, said third transistor being rendered conductive by the input signal exceeding said first threshold voltage for causing said first threshold voltage to be reduced to said second threshold voltage; and collector means responsive to said second transistor becoming saturated for preventing saturation current therefrom being sourced to the substrate of the integrated circuit, said collector means including a secondary region formed within the integrated circuit in spaced relationship about said collector region of said second transistor, said secondary region collecting said saturation current that otherwise would be injected into said substrate, a fourth transistor the base region of which is connected to said secondary region and having a collector region and an emitter region, said emitter region being connected to a source of ground reference potential, an additional multiple collector region transistor having an emitter region coupled to said power supply, a base region coupled with one of said multiple collector regions to said collector region of said fourth transistor, and a second one of said multiple collector regions being coupled to said collector region of said second transistor.

* * * * *